US010362151B2

(12) United States Patent
Gligoroski et al.

(10) Patent No.: US 10,362,151 B2
(45) Date of Patent: Jul. 23, 2019

(54) CODING IN GALOIS FIELDS WITH REDUCED COMPLEXITY

(71) Applicant: Memoscale AS, Trondheim (NO)

(72) Inventors: Danilo Gligoroski, Trondheim (NO); Katina Kralevska, Trondheim (NO)

(73) Assignee: MEMOSCALE AS, Trondheim (NO)

( * ) Notice: Subject to any disclaimer, the term of this patent is extended or adjusted under 35 U.S.C. 154(b) by 378 days.

(21) Appl. No.: 15/319,428

(22) PCT Filed: Jun. 15, 2015

(86) PCT No.: PCT/EP2015/063337
§ 371 (c)(1),
(2) Date: Dec. 16, 2016

(87) PCT Pub. No.: WO2015/197413
PCT Pub. Date: Dec. 30, 2015

(65) Prior Publication Data
US 2017/0142238 A1    May 18, 2017

(30) Foreign Application Priority Data
Jun. 27, 2014  (GB) .................................. 1411503.4

(51) Int. Cl.
*H04L 1/00*        (2006.01)
*H04L 29/08*       (2006.01)
(Continued)

(52) U.S. Cl.
CPC ............ *H04L 69/324* (2013.01); *H03M 7/00* (2013.01); *H03M 13/353* (2013.01);
(Continued)

(58) Field of Classification Search
CPC combination set(s) only.
See application file for complete search history.

(56) References Cited

U.S. PATENT DOCUMENTS

2007/0195894 A1   8/2007  Shokrollahi et al.
2007/0300127 A1   12/2007 Watson
(Continued)

OTHER PUBLICATIONS

Bin Guo et al., A Practical Network Coding Scheme over GF(2q) for Multi-User Cooperative Communication, 2011 IEEE Global Telecommunications Conference—GLOBECOM 2011 (Year: 2011).*
(Continued)

*Primary Examiner* — Khang Do
(74) *Attorney, Agent, or Firm* — Saliwanchik, Lloyd & Eisenschenk

(57) ABSTRACT

Disclosed herein is a method of generating a coded data packet in dependence on a plurality of source data packets, the method comprising: determining a plurality of data packets, for generating a coded data packet, from a plurality of source data packets for encoding, wherein each of the plurality of source data packets for encoding comprises the same number of bits; generating a multiplied data packet in dependence on one or more multiplication operations between a multiplication value and bits of one of the determined data packets; and generating a coded data packet in dependence on a combination of the multiplied data packet and one or more of the other of said plurality of determined data packets that have not been multiplied; wherein the one or more multiplication operations are performed as operations in the finite field GF(p); p is greater than 2; the multiplication value is an element of the finite field GF(p); the multiplication value is not 0 or 1; and the combination of data packets is performed by bitwise XOR operations. Advantageously, the coding scheme can be almost as computationally efficient as GF(2) and the likelihood of obtained coded data packets being linearly independent is greatly increased.

24 Claims, 3 Drawing Sheets

(51) Int. Cl.
  *H03M 13/35* (2006.01)
  *H03M 13/37* (2006.01)
  *H03M 13/00* (2006.01)
  *H03M 7/00* (2006.01)
  *H04L 29/06* (2006.01)

(52) U.S. Cl.
  CPC ....... *H03M 13/373* (2013.01); *H03M 13/616* (2013.01); *H04L 1/0009* (2013.01); *H04L 1/0076* (2013.01); *H04L 69/22* (2013.01)

(56) References Cited

U.S. PATENT DOCUMENTS

| | | | | |
|---|---|---|---|---|
| 2009/0135717 | A1* | 5/2009 | Kamal | H04J 3/14 370/225 |
| 2011/0026429 | A1* | 2/2011 | Ben Slimane | H04B 7/15521 370/252 |
| 2012/0128009 | A1* | 5/2012 | Yang | H03M 13/2906 370/432 |
| 2012/0155531 | A1 | 6/2012 | Yi et al. | |
| 2013/0286886 | A1* | 10/2013 | Laabs | H04L 1/0002 370/252 |
| 2014/0064296 | A1* | 3/2014 | Haeupler | H04L 49/90 370/412 |
| 2014/0379858 | A1* | 12/2014 | Mahdaviani | H04L 67/02 709/217 |
| 2015/0281406 | A1* | 10/2015 | Lucani | H04L 1/0057 370/477 |
| 2015/0358037 | A1* | 12/2015 | Li | G06F 11/1088 714/763 |

OTHER PUBLICATIONS

Pratik Patil et al., Network coding design for multi-source multi-relay cooperative wireless networks, 2012, TENCON 2012 IEEE Region 10 Conference (Year: 2012).*

Ming Xiao et al., M-user cooperative wireless communications based on nonbinary network codes, 2009 IEEE Information Theory Workshop on Networking and Information Theory (Year: 2009).*

Najeem et al., On enhancing the random linear network coding, 2011 17th IEEE International Conference on Networks (pp. 246-251) (Year: 2011).*

Bin Guo et al., "A Practical Network Coding Scheme Over GF (2q) for Multi-User Cooperative Communication", Global Telecommunications Conference, IEEE, Dec. 5, 2011, pp. 1-5.

Pratik Patil et al., "Network coding design for multi-source multi-relay cooperative wireless networks", TENCON IEEE Conference, Nov. 19, 2012, pp. 1-6.

Ming Xiao et al., "M-user cooperative wireless communications based on nonbinary network codes", IEEE Workshop on Networking and Information Theory, Jun. 12, 2009, pp. 316-320.

Mao Yuexin et al., "A new iterative LT decoding algorithm for binary and nonbinary Galois fields", Journal of Communications and Networks, IEEE, vol. 15, No. 4, Aug. 2013, pp. 411-421.

Jalil Amir Minayi et al., "Distributed coding based on partial relay selection", 2014 IEEE Wireless Communications and Networking Conference, IEEE, Apr. 6, 2014, pp. 758-763.

Joa Gdp O Luiz Rebelatto et al., "Multiuser Cooperative Diversity Through Network Coding Based on Classical Coding Theory", IEEE Transactions on Signal Processing, IEEE, vol. 60, No. 2, Feb. 2012, pp. 916-926.

International Search Report, PCT/EP2015/063337, PCT/ISA/210, dated Aug. 10, 2015.

Kralevska et al., "Balanced XOR-ed Coding," Advances in Communication Networking, 19th EUNICE/IFIP WG 6.6 International Workshop, Aug. 28-30, 2013, pp. 161-172, Springer Verlag.

Yi, "Hybrid Random Network Coding," Proceedings of the 6th International Conference on Wireless Algorithms, Systems and Applications (WASA), China, Aug. 11-13, 2011, pp. 202-210, Springer Verlag.

Search Report, GB1411503.4, dated Dec. 18, 2014.

* cited by examiner

GF(8) numbers 0, 1, 2, 3, 4, 5, 6 and 7 represented as triplets of bits:

| 0 | 1 | 2 | 3 | 4 | 5 | 6 | 7 |
|---|---|---|---|---|---|---|---|
| 000 | 001 | 010 | 011 | 100 | 101 | 110 | 111 |

FIG. 1A

Results of addition operations between numbers in GF(8)

| + | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 1 | 0 | 3 | 2 | 5 | 4 | 7 | 6 |
| 2 | 2 | 3 | 0 | 1 | 6 | 7 | 4 | 5 |
| 3 | 3 | 2 | 1 | 0 | 7 | 6 | 5 | 4 |
| 4 | 4 | 5 | 6 | 7 | 0 | 1 | 2 | 3 |
| 5 | 5 | 4 | 7 | 6 | 1 | 0 | 3 | 2 |
| 6 | 6 | 7 | 4 | 5 | 2 | 3 | 0 | 1 |
| 7 | 7 | 6 | 5 | 4 | 3 | 2 | 1 | 0 |

FIG. 1B

Results of multiplication operations between numbers in GF(8)

| x | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 4 | 6 | 5 | 7 | 1 | 3 |
| 3 | 0 | 3 | 6 | 5 | 1 | 2 | 7 | 4 |
| 4 | 0 | 4 | 5 | 1 | 7 | 3 | 2 | 6 |
| 5 | 0 | 5 | 7 | 2 | 3 | 6 | 4 | 1 |
| 6 | 0 | 6 | 1 | 7 | 2 | 4 | 3 | 5 |
| 7 | 0 | 7 | 3 | 4 | 6 | 1 | 5 | 2 |

FIG. 1C

CODING IN GALOIS FIELDS WITH REDUCED COMPLEXITY

CROSS-REFERENCE TO RELATED APPLICATIONS

This application is a national stage application of International Patent Application No. PCT/EP2015/063337, filed Jun. 15, 2015, which claims priority to Great Britain Application Number 1411503.4, filed Jun. 27, 2014, the disclosures of each of which are incorporated herein by reference in their entirety, including any figures, tables, and drawings.

FIELD OF THE INVENTION

The present invention relates to the coding of data packets for applications such as data transmission, data storage systems and network coding in general. Embodiments of the invention perform a multiplication operation on a source data packet in a GF field that is higher than GF(2). This increases the likelihood of a coded data packet generated in dependence on the multiplied data packet being linearly independent to other coded data packets. A coded data packet is then efficiently generated by combining the multiplied data packet with other source data packets that have not been multiplied.

BACKGROUND TO THE INVENTION

In the last decade, network coding has attracted a lot of interest. The advantages of network coding include improved throughput, robustness, scalability, and security. The performance gains are achieved by combining algebraically the packets at sources and/or at intermediate nodes in the network.

Network coding was first introduced in the seminal paper by R. Ahlswede, N. Cai, S. Y. R. Li, and R. W. Yeung, Network information flow, IEEE Transactions on Information Theory, 46(4):1204-1216, 2000. Both linear network coding, LNC, and random linear network coding, RLNC, achieve capacity when the field size is sufficiently large. However, performing operations in large finite fields is costly and complex.

RLNC in higher fields can be several orders of magnitude more energy demanding and up to one order of magnitude slower than the encoding done by simple XOR operations. This has been reported in, for example, H. Shojania and B. Li, Random network coding on the iphone: fact or fiction?, NOSSDAV, 2009; M. V. Pedersen, F. H. P. Fitzek, and T. Larsen, Implementation and performance evaluation of network coding for cooperative mobile devices, In Proc. IEEE Cognitive and Cooperative Wireless Networks Workshop, 2008; and P. Vingelmann, M. V. Pedersen, F. H. P. Fitzek, and J. Heide, Multimedia distribution using network coding on the iphone platform, Proceedings of the 2010 ACM multimedia workshop on Mobile cloud media computing, 2010. Some of the limitations of RLNC may therefore be overcome by implementing network coding only by XOR operations.

Usually randomized strategies are used for generating network codes, and not many structured strategies are known. The known structured approaches to network coding are mostly based on combinatorial design theory. Combinatorial design theory is an area of combinatorial mathematics with many communications applications. Sending linear combinations of packets instead of uncoded data offers security against eavesdropping attacks. In N. Cai and R. W. Yeung, Secure network coding, In IEEE International Symposium on Information Theory, page 323, 2002; the authors incorporate network coding and information security based on Shamir's secret sharing algorithm. The authors in K. Harada and H. Yamamoto, Strongly secure linear network coding, IEICE Transactions, 91-A(10):2720-2728, 2008; present an algorithm on how to construct a strongly k-secure network code and how to transform a nonsecure linear network code to a strongly k-secure network code if the alphabet size is sufficiently large. Although there are codes that can empower security in coded networks, the big alphabet size of these coding approaches is not desirable.

Erasure codes are becoming increasingly preferable for packet switching communications since they allow efficient recovery from packet losses. Another important application for erasure codes is in storage systems. The data storage requirements of a large storage system may be hundreds of exabytes, or even a plurality of zettabytes. For such storage systems, erasure codes are preferably used in order to tolerate and recover efficiently from multiple disk failures.

According to the rate of redundancy that is used, erasure codes are divided in two classes: 1. Optimal or very close to optimal ones, known as Maximum Distance Separable, MDS, Codes, almost-MDS, AMDS, and near-MDS codes, NMDS, and 2: Suboptimal or non-MDS codes. Reed-Solomon codes are a well known class of MDS codes that provide a general technique for construction of MDS codes. However, these codes are defined in high finite fields and they are dense codes, i.e. there are many operations in the high field and this leads to high computational complexity.

Raptor codes, as disclosed in A. Shokrollahi and M. Luby, "Raptor codes," Foundations and Trends in Communications and Information Theory, vol. 6, no. 3-4, pp. 213-322, May 2011, form another type of erasure codes. They are rate-less codes as they can (in theory) produce an infinite number of encoding symbols. Two versions exist: Raptor, as disclosed in M. Luby, A. Shokrollahi, M. Watson, and T. Stockhammer, "Raptor Forward Error Correction Scheme for Object Delivery," October 2007, IETF Request for Comments, RFC 5053, and RaptorQ, as disclosed in M. Luby, A. Shokrollahi, M. Watson, T. Stockhammer, and L. Minder, "RaptorQ Forward Error Correction Scheme for Object Delivery," IETF Request for Comments, RFC 6330 (Standards Track), August 2011. The main difference between them is that Raptor are binary codes (like LDPC), while RaptorQ are non-binary codes as they partially rely, like the Reed-Solomon codes, on operations over GF(256).

In RLNC, random linear combinations of data packets are generated over a Galois Field of size q, GF(q). The field size has an impact on the decoding probability, i.e., the probability of receiving linearly independent packets increases with q. When one or more sources want to transmit k packets to one or more destination nodes, the channel conditions must be considered. Even in a presence of packet losses (i.e. erasures) the destination node has to be able to decode k original packets by receiving k+r packets. In Daniel Enrique Lucani, Muriel Médard, and Milica Stojanovic. Random linear network coding for time-division duplexing: Field size considerations, GLOBECOM, pages 1-6. IEEE, 2009, the authors derive the average number of received coded packets n for successful decoding of k original packets at the destination nodes. They study the effect of q on the performance of RLNC and the probability that k out of k+r received packets are linearly independent. The paper shows that q equal to 4 or 8 is enough to get very close to optimal performance even when k is not very large.

However, working in high fields or with a large number of data packets increases the computational complexity and therefore increases energy consumption. RLNC in high fields is therefore not suitable for implementation on devices that have power and memory constraints.

Accordingly, a number of problems are experienced by known approaches to generating coded data packets.

SUMMARY OF THE INVENTION

According to a first aspect of the invention, there is provided a method of generating a coded data packet in dependence on a plurality of source data packets, the method comprising: determining a plurality of data packets, for generating a coded data packet, from a plurality of source data packets for encoding, wherein each of the plurality of source data packets for encoding comprises the same number of bits; generating a multiplied data packet in dependence on one or more multiplication operations between a multiplication value and bits of one of the determined data packets; and generating a coded data packet in dependence on a combination of the multiplied data packet and one or more of the other of said plurality of determined data packets that have not been multiplied; wherein the one or more multiplication operations are performed as operations in the finite field GF(p); p is greater than 2; the multiplication value is an element of the finite field GF(p); the multiplication value is not 0 or 1; and the combination of data packets is performed by bitwise XOR operations.

Preferably the method further comprises generating one or more further coded data packets in dependence on said plurality of source data packets for encoding, wherein each of the further coded data packets is generated by: determining a plurality of data packets, for generating the further coded data packet, from said plurality of source data packets for encoding; generating a further multiplied data packet in dependence on one or more multiplication operations between a further multiplication value and bits of one of the determined data packets for generating the further coded data packet; and generating the further coded data packet in dependence on a combination of the further multiplied data packet and one or more of the other of the determined data packets for generating the further coded data packet that have not been multiplied; wherein each multiplication value is element of the same finite field GF(p); each multiplication value is not 0 or 1; and the combination for generating each further encoded data packet is performed by bitwise XOR operations.

Preferably, the determined plurality of data packets of for generating each coded data packet are determined in dependence on a Latin rectangle.

Preferably, the method further comprises: generating the Latin rectangle by generating a Latin square; and selecting a plurality of either the rows or the columns of the Latin square.

Preferably, the method further comprises: generating a Latin rectangle; and generating a non-singular matrix of binary values in dependence on the Latin rectangle; wherein each of the determined plurality of data packets for generating a coded data packet is determined in dependence on the binary values in either a single a row or a single column of said non-singular matrix of binary values.

Preferably, the determined plurality of data packets for generating a coded data packet are determined by the binary '1' values in either a single a row or a single column of said non-singular matrix of binary values.

Preferably, the method further comprises selecting a row or column of the Latin rectangle; and determining one of the determined plurality of data packets for multiplication to generate a multiplied data packet in dependence on a value in the selected row.

Preferably, the row or column of the Latin rectangle is randomly selected.

Preferably, one or more of the coded data packets, optionally all of the coded data packets, are generated in dependence on only one multiplied data packet and all of the other of the plurality of determined data packets for generating the coded data packet.

Preferably, p is 4 or 8.

Preferably, the method further comprises randomly selecting the multiplication values from the values in the GF(p) field that are not 0 or 1.

Preferably, each multiplied data packet is generated by multiplying each of a plurality of blocks of bits of the data packet by the same multiplication value such that the multiplied data packet comprises the results of the multiplications for each of the blocks of bits; wherein the number of bits in each block is determined by the number of bits required for a binary representation of an element in the GF(p) field.

Each of the one or more multiplication operations for generating a multiplied data packet are performed by a look-up operation or by other techniques for multiplication in the field GF(p).

Preferably, the method comprises generating a set of coded data packets that encodes all of said plurality of source data packets for encoding, the method further comprising: generating one or more additional coded data packets, that are redundant data packets, by, for each additional coded data packet: determining a plurality of data packets, for generating the further coded data packet, from said plurality of source data packets for encoding; generating a further multiplied data packet in dependence on one or more multiplication operations between a further multiplication value and bits of one of the determined data packets for generating the additional coded data packet; and generating the additional coded data packet in dependence on a combination of the further multiplied data packet and one or more of the other of the determined data packets for generating the additional coded data packet that have not been multiplied; wherein each multiplication value is element of the same finite field GF(p); each multiplication value is not 0 or 1; and the combination for generating each further encoded data packet is performed by bitwise XOR operations.

Preferably, the set of coded data packets that encodes all of said plurality of source data packets for encoding is generated in dependence on a Latin rectangle, such that the set of coded data packets are encoded and/or decodable in a balanced manner.

According to a second aspect of the invention, there is provided a method of generating a systematic set coded data packets, the method comprising generating a systematic set of coded data packets that comprises all of said plurality of source data packets for encoding and at least one coded data packet, that is a redundant data packet, and generated according to the method of the first aspect.

Preferably, in the method according to the first and/or second aspect, one of the coded data packets that is a redundant data packet is generated in dependence on all of the source data packets for encoding.

Preferably, in the method according to the first and/or second aspect, the plurality of data packets for generating one or more coded data packets that are redundant data packets are determined in dependence on a random Hill climbing algorithm.

Preferably, in the method according to the first and/or second aspect, the method further comprising the steps of: obtaining a matrix that is dependent on determined multiplication values for generating each of the multiplied data packets and the determined data packets for combining to generate each coded data packet; determining if the obtained matrix is non-singular and/or has a rank greater than or equal to a predetermined value; if the matrix is singular and/or has a rank below the predetermined value, repeatedly changing one or more of the multiplication values and/or determined data packets for multiplying by a multiplication value until it is determined that the matrix is non-singular and/or has a rank greater than or equal to the predetermined value; and determining the data packets and multiplication values for using to generate the coded data packets in dependence on the values in the matrix that has been determined to be non-singular and/or have a rank greater than or equal to a predetermined value.

Preferably, in the method according to the first and/or second aspect, the method further comprises: determining a first dimension of the Latin rectangle in dependence on the number of non-redundant coded data packets to be generated; and determining a second dimension of the Latin rectangle in dependence on a desired number of data packets for generating each coded data packet without redundancy being applied, wherein the second dimension is less than the first dimension.

Preferably, in the method according to the first and/or second aspect, the method further comprises changing the second dimension of the Latin rectangle such that the second dimension is increased in response to a determination to increase the coding and/or decoding complexity of the coded data packets, and the second dimension of the Latin rectangle is decreased in response to a determination to decrease the coding and/or decoding complexity of the coded data packets.

Preferably, in the method according to the first and/or second aspect, the method further comprises: performing the method in a source of data packets in a network; and transmitting the coded data packets over the network.

Preferably, in the method according to the first and/or second aspect, the method further comprises: buffering one or more of the coded data packets prior to the one or more buffered coded data packets being transmitted; and transmitting the coded data packets in a series of phases.

Preferably, in the method according to the first and/or second aspect, the method further comprises storing the coded data packets in a storage system.

According to a third aspect, there is provided a coding apparatus configured to perform the method of the first and/or second aspect.

BRIEF DESCRIPTION OF DRAWINGS

Embodiments of the invention will now be described, by way of example only, with reference to the accompanying drawings, in which:

FIG. 1 shows the mathematical theory of GF(8) operations;

DETAILED DESCRIPTION

Figure 2:
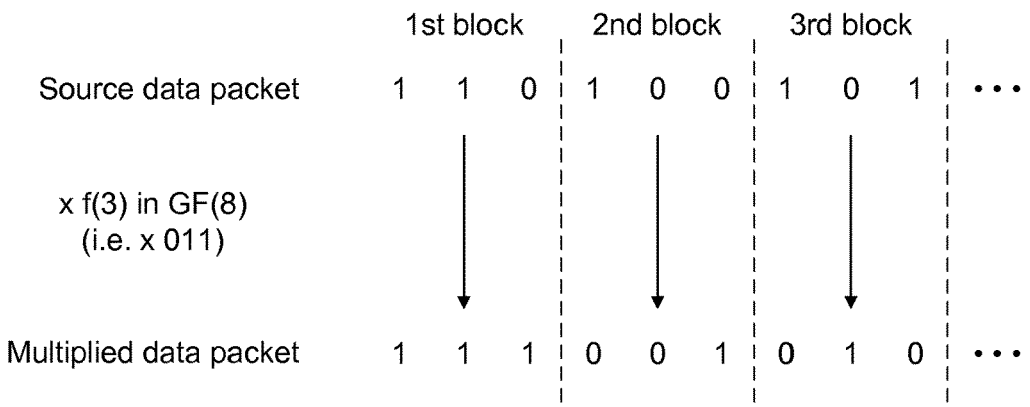
FIG. 2 shows an operation performed in the generation of a coded data packet according to embodiments.

Embodiments of the invention improve on known coding techniques to solve at least some of the above-identified problems.

In network coding, a plurality of source data packets are combined to generate each coded data packet. At a decoder, a plurality of coded data packets are required to recover each source data packet. In order for a coded data packet obtained by a decoder to contribute to the decoding process, it is necessary for the obtained coded data packet to be linearly independent from all other coded data packets obtained by the decoder.

The coding techniques of embodiments encode data packets in a way that ensures that obtained coded data packets have a high likelihood of being linearly independent and are therefore likely to contribute to the decoding process. In addition, the encoding of data packets is performed in a computationally efficient way.

According to embodiments, a plurality of data packets are used to generate each coded data packet with at least one of the data packets being multiplied by a value from a Galois field, GF field, that is higher than GF(2). Each coded data packet is generated by combining the multiplied data packet with other data packets that have not been multiplied.

Advantageously, by performing most of the combination operations on data packets that have not been multiplied, the operations for generating coded data packets have similar complexity to those for generating coded data packets over GF(2) and therefore have low computational and power demands. In addition, the likelihood of coded data packets being linearly independent from each other is greatly increased by creating each coded data packet in dependence on a data packet that has been multiplied by a value from the higher GF field than GF(2). This increases the likelihood that an obtained set of coded data packets can be decoded.

In a first embodiment, for each of a plurality of coded data packets to be generated, a plurality of source data packets are determined. For each coded data packet, one of the data packets is then multiplied with a value from a higher GF field than GF(2) and the coded data packet is then generated by combining the multiplied data packet with the other data packets that are not multiplied.

In a second embodiment, one or more redundant coded data packets are generated. One of the data packets used to generate each redundant coded data packet is multiplied by a value from a higher GF field than GF(2) and each redundant data packet is then generated by combining data packets with data packets that have not been multiplied.

Embodiments include the generation of both a non-systematic set of coded data packets as well as a systematic set of coded data packets.

An exemplary implementation of the first embodiment is described in detail below.

In a first embodiment, for each of a plurality of coded data packets to be generated, a plurality of source data packets for combining to generate the coded data packet are first determined. In a particularly preferred implementation of the first embodiment, the set of data packets for combining to generate each coded data packet is determined according to the techniques described in K. Kralevska, D. Gligoroski, and H. Øverby; 'Balanced XOR-ed coding'; In Advances in Communication Networking, 19th EUNICE/IFIP, volume 8115 of LNCS, pages 161-172. Springer, 2013, the entire contents of which are incorporated herein by reference. Advantageously, this results in balanced encoding and/or decoding of data packets, i.e. the same number of source data packets are required to generate each coded data packet and/or the same number of coded data packets are required to recover each source data packet.

In the presently described exemplary implementation of the first embodiment, one of the data packets in each of the coded data packets is multiplied by a value from the finite field GF(8) and each coded data packet is then generated by combining the multiplied data packet with other data packets using operations on data packets that have not been multiplied.

In order to determine the data packets for combining to generate each coded data packet, a k×k Latin square is determined where k represents the number of source data packets for encoding. In the presently described exemplary implementation of the first embodiment k=5 and the Latin square has the form shown below:

$$\begin{bmatrix} 4 & 2 & 3 & 5 & 1 \\ 2 & 3 & 1 & 4 & 5 \\ 1 & 5 & 4 & 3 & 2 \\ 3 & 1 & 5 & 2 & 4 \\ 5 & 4 & 2 & 1 & 3 \end{bmatrix}$$

The below Latin rectangle is then generated by taking the first three rows of the Latin square:

$$\begin{bmatrix} 4 & 2 & 3 & 5 & 1 \\ 2 & 3 & 1 & 4 & 5 \\ 1 & 5 & 4 & 3 & 2 \end{bmatrix}$$

The number of rows of the Latin rectangle defines the number of source data packets that are used to generate each coded data packet. The coding complexity could therefore be increased by instead generating a Latin Rectangle with 4 rows. The general rule is that the encoding and/or decoding complexity can be decreased by generating a Latin rectangle from fewer rows of the Latin square and increased by generating a Latin rectangle from a greater number of rows of the Latin square. Increasing the coding/decoding complexity increases the security of the coded data packets as more coded data packets are required in order to determine a source data packet. However, increasing the coding/decoding complexity also increases the computational requirements at the data encoder and decoder.

The Latin rectangle is then used to generate the following non-singular incidence matrix of binary values:

$$\begin{bmatrix} 1 & 1 & 0 & 1 & 0 \\ 0 & 1 & 1 & 0 & 1 \\ 1 & 0 & 1 & 1 & 0 \\ 0 & 0 & 1 & 1 & 1 \\ 1 & 1 & 0 & 0 & 1 \end{bmatrix}$$

The values in each column of the Latin rectangle have defined the position of the non-zero values in a respective row of the above incidence matrix. That is to say, the values in the first column of the Latin Rectangle are 4, 2, and 1. The $4^{th}$, $2^{nd}$ and $1^{st}$ values in the first row of the incidence matrix are therefore defined by the Latin rectangle as 1 values, with the other values in the first row defined as 0. Similarly, the values in the second column of the Latin Rectangle are 2, 3, and 5. The $2^{nd}$, $3^{rd}$ and $5^{th}$ values in the second row of the incidence matrix are therefore defined as 1 values, with the other values defined as 0. More generally, the $j^{th}$ column of the Latin Rectangle defines the 1 and 0 positions in the $j^{th}$ row of the incidence matrix.

Each row of the incidence matrix defines data packets for combining to generate a coded data packet. That is to say, columns 1 to 5 of the incidence matrix respectively correspond to source data packets for encoding x1 to x5. Rows 1 to 5 of the incidence matrix respectively correspond to the coded data packets cp1 to cp5. The data packets determined for generating each coded data packet are only those with a '1' value in the row for the coded data packet.

Coded data packets are generated by combining the determined source data packets for generating each coded data packet using bitwise XOR operations. The above incidence matrix therefore defines the following coded data packets:

$c_{p1} = x_1 \oplus x_2 \oplus x_4$ $c_{p2} = x_2 \oplus x_3 \oplus x_5$ $c_{p3} = x_1 \oplus x_3 \oplus x_4$ $c_{p4} = x_3 \oplus x_4 \oplus x_5$ $c_{p5} = x_1 \oplus x_2 \oplus x_5$ The mathematical theory behind the above-described technique for determining the source data packets for generating each coded data packet in a balanced manner is provided in the above-cited, and incorporated herein, 'Balanced XOR-ed coding' paper. The techniques therein are explicitly taught as being operations applicable over the finite field GF(2) only.

Advantageously, the coded data packets are balanced since the same number of source data packets are required to generate each coded data packet. Each coded data packet is therefore generated with the same complexity and there are also a number of security advantages. The source data packets for combining to generate each coded data packet could alternatively have been determined in a similar manner but in dependence on the inverse of the incidence matrix. This would result in the decoding of the coded data packets being balanced.

The first embodiment improves on the above-described technique for generating coded data packets by greatly increasing the probability that obtained coded data packets are linearly independent with only a small increase in coding complexity.

According to the first embodiment, one of the data packets for generating each coded data packet is multiplied by performing one or more multiplication operations by a multiplication value, other than 0 or 1, from a higher GF field than GF(2).

An example of a higher GF field than GF(2) is GF($2^3$), i.e. GF(8). FIG. 1A shows the binary representation of values in GF(8). FIG. 1B shows the results of bitwise XOR addition operation on the values in GF(8). FIG. 1C shows the results of multiplication operations between values in GF(8). The shown GF(8) results in FIG. 1C have been constructed based on the irreducible polynomial: $1+x^2+x^3$. Embodiments include other results for the GF(8) multiplication operations, as would be generated by the use of a different irreducible polynomial.

The source data packet that is multiplied by the multiplication value from the higher GF field may be randomly selected, or selected in any predetermined manner, for each coded data packet. However, the data packets for multiplication are preferably selected in a manner that ensures that, across all of the coded data packets, each one of the source data packets is multiplied approximately the same number of times.

If the data packets for combining to generate each coded data packet are determined in dependence on a Latin rectangle as described above, then a preferred technique for selecting a source data packet to multiply is to select one of the rows of the Latin rectangle. The row may be randomly selected or a predetermined selection of a row may be made. For example, the third row may be chosen as shown below:

|1 5 4 3 2|

Any GF field higher than GF(2) may be chosen for multiplying the data packets. In the present exemplary implementation of the first embodiment, the higher GF field is GF(8).

The values in the selected row are then used to determine '1' values in the incidence matrix, and thereby identify data packets for multiplying. The values of the first to fifth elements of the selected row respectively identify a single element in each the first to fifth rows of the incidence matrix. Each of the identified values is then multiplied by a value from the higher GF field than GF(2). The value from the higher GF field is randomly selected from all values in the higher GF field apart from 0 or 1.

The element '1' in the selected row is in the first column and this corresponds to first row of the incidence matrix. The value '1' identifies the first element in the first row of the incidence matrix. Accordingly, the first element of the first row of the incidence matrix is replaced by a value, other than 0 or 1, from the higher GF field. Similarly, the element '5' in the selected row identifies to the fifth element in the second row of the incidence matrix and this is then replaced by a value, other than 0 or 1, from the higher GF field. This process is used to identify one element in each row of the incidence matrix for multiplication by a value from the higher GF field.

Accordingly, the resulting matrix may have the form:

$$\begin{bmatrix} f(3) & 1 & 0 & 1 & 0 \\ 0 & 1 & 1 & 0 & f(7) \\ 1 & 0 & 1 & f(6) & 0 \\ 0 & 0 & f(5) & 1 & 1 \\ 1 & f(4) & 0 & 0 & 1 \end{bmatrix}$$

In the above matrix, f(3), f(4), f(5), f(6) and f(7) are respectively the numbers 3 to 7 in the finite field GF(8) and are multiplication values for generating a multiplied data packet.

There is only one multiplication value in each column of the above matrix and this demonstrates the advantage of the above technique for selecting data packets to be multiplied, namely each of the source data packets is multiplied the same number of times over the entire set of generated coded data packets.

All of the multiplication values, '1' values and '0' values in the above matrix may be considered to be values in the finite field GF(8) that data packets are multiplied by prior to the data packets being combined to generate a coded data packet. However, it is only the multiplying by the multiplication values that requires significant processing resources. Multiplying by 0 indicates that a data packet is not used in generating a particular coded data packet and multiplying by 1 indicates that a data packet is used to generate a coded data packet. Multiplying by 1, i.e. a multiplication by 1 operation, does not change the values in a data packet and is not a multiplication operation that needs to be performed. Advantageously, source data packets that are indicated as being multiplied by 1 are therefore directly combinable with other data packets when generating a coded data packet.

The above matrix is not necessarily suitable for encoding data packets as it needs to have an inverse and/or suitably large rank in order for coded data packets generated according to the matrix to be decodable. Preferably, a check is therefore performed on the above matrix to determine if it is non-singular and/or if the rank is greater than or equal to a predetermined value. In the event that the matrix is not non-singular and/or has a rank below the predetermined value, then the matrix is changed such that other 1 values of the incidence matrix are replaced and/or other multiplication values are used, with the condition of the multiplication values not being 0 or 1 still being maintained. This process is repeated until a non-singular matrix and/or matrix with a rank greater than or equal to a predetermined value, with at least one multiplication value in each row, is obtained.

Each row of the matrix is then used to determine how to generate a respective coded data packet with the non-zero values in each row defining the data packets used for generating the code word. That is to say, columns 1 to 5 of the matrix respectively correspond to data packets x1 to x5. Rows 1 to 5 of the matrix respectively correspond to the coded data packets c1 to c5.

The combination operations are bitwise XOR operations. Accordingly, the coded data packets are generated as:

$c_1 = f(3)x_1 \oplus x_2 \oplus x_4$ $c_2 = x_2 \oplus x_3 \oplus f(7)x_5$ $c_3 = x_1 \oplus x_3 \oplus f(6)x_4$ $c_4 = f(5)x_3 \oplus x_4 \oplus x_5$ $c_5 = x_1 \oplus f(4)x_2 \oplus x_5$ It is clear from the above-defined coded data packets that the computational advantages of operations over only GF(2) are substantially maintained since the increase in coding complexity is only due to the single additional multiplication operation required to generate each coded data packet. The effect of this advantage greatly increases when the number of source data packet used to generate each data packet is increased.

The generation of a multiplied data packet by multiplying a data packet by the multiplication value is described below with reference to FIGS. 1 and 2.

FIG. 2 shows the first 9 bits of a source data packet, such as x1, as being 110100101. The multiplication value that is being used to multiply the data packet is from the finite field GF(8) and so the multiplication value has a 3 bit binary representation. For c1, the value in GF(8) that is being used to multiply x1 is f(3), which is represented in binary as 011.

All of the bits of the data packet are treated as separate neighbouring blocks, with each block comprising the same number of bits, the number of bits defined as that required to represent an element of the higher GF field in binary. For a multiplication value in GF(8), the blocks each comprise 3 data bits. A multiplication operation is then performed in the higher GF field between the multiplication value, f(3), and each of the blocks of bits.

In the example shown in FIG. 2, the first multiplication operation is between 110 and 011, which is f(6) multiplied by f(3). As can be seen from FIGS. 1A and 1C, the result of this multiplication in GF(8) is f(7) and so the result is 111 in binary.

The second multiplication operation is between 100 and 011, which is f(4) multiplied by f(3). The result of this multiplication in GF(8) is f(1) and so the result is 001 in binary.

The third multiplication operation is between 101 and 011, which is f(5) multiplied by f(3). The result of this multiplication in GF(8) is f(2) and so the result is 010 in binary.

This multiplication process by f(3) is performed for all of the blocks that the data packet has been divided into. A preferred technique for determining the result of each multiplication is to obtain the result from a look-up table rather than actually computing each result.

As shown in FIG. 2, the multiplied data packet comprises the binary results of the multiplication operations on all of the blocks of bits.

The multiplying operation by the multiplication value therefore comprises a plurality of multiplication operations when the length of the data packet is longer than the number of bits required to represent the multiplication value in binary. The multiplying operation does not change the length of a data packet, only the binary values within the data packet.

The above described technique is used to generate each multiplied data packet with the number of bits in each block that the data packet is divided into determined by the size of the GF field used for the multiplying operation. According, if the multiplying was instead by multiplication values in GF(4), each block would comprise 2 bits, as 2 bits are required to represent a value of GF(4) in binary.

Each of the coded data packets is generated by combining the multiplied data packet with the other data packets that were determined for generating the coded data packet by computationally efficient bitwise XOR operations.

Advantageously, by multiplying a data packet used to generate each code word by an element from a higher GF field that is not 0 or 1, the likelihood of obtained coded data packets being linearly independent is increased. The computational requirements for generating each coded data packet are low since most of the source data packets that are combined are not multiplied and are operated on as in GF(2).

The decoding of the coded data packets generated according to the embodiments may be by Gaussian elimination, which is a well known decoding technique to skilled persons in the art. The decoding of the data packets according to embodiments may also be based on any other known decoding technique. In particular, decoding information required by the decoder may be obtained by generating the inverse of a matrix that defines which source data packets are used to generate each coded data packet and how each of the source data packets are multiplied.

Provided that a decoder receives a predetermined number of linearly independent coded data packets, the decoder is able to recover all of the source data packets. The predetermined number of linearly independent coded data packets required depends on the coding scheme used.

According to a second embodiment, one or more redundant coded data packets are generated. Each of the redundant coded data packets is generated by multiplying one of the source data packets by a multiplication value, other than 0 or 1, from a higher GF field than GF(2) and then combining the multiplied data packet with other data packets that have not been multiplied. Advantageously, the likelihood of obtained redundant coded data packets being linearly independent to other obtained data packets is increased with only a small increase in the computational complexity required to generate the redundant coded data packets.

The technique for multiplying a source data packet and combining the multiplied data packet with other data packets is as described for the first embodiment.

The redundant coded data packets of the second embodiment may be used to provide redundancy to any set of data packets.

A preferable first implementation of the second embodiment is described below in which redundant data packets are generated for the set of coded data packets generated in the above-described implementation of the first embodiment.

Preferably, the incidence matrix of the first embodiment is modified to include the redundant data packets. The generated code is a (n, k) code, where:
n=the number of code words; and
k=the number of original data packets The non-singular incidence matrix of binary values is generated as described above for the first embodiment. The number of rows of the matrix is then increased by (n−k) rows with each of the added rows consisting of binary values. The binary values of each of the elements in the added rows may be randomly generated subject to the condition that there is at least one 1 value in each row, or selected in a predetermined manner, such as by using values that are known to be good for generating redundant coded data packets given the already determined source data packets for generating each coded data packet. Preferably, a heuristic technique, such as random Hill climbing is used to iteratively improve the binary values that define the data packets for combining to generate the redundant coded data packets.

In the present exemplary implementation of the second embodiment, source data packets are determined for generating a (9, 5) code.

First, a 5 by 5 incidence matrix is generated as described for the first embodiment. The generated additional rows of binary values for the incidence matrix may be as shown below:

$$\begin{bmatrix} 1 & 1 & 1 & 1 & 1 \\ 1 & 0 & 1 & 1 & 0 \\ 1 & 1 & 1 & 1 & 0 \\ 1 & 1 & 0 & 1 & 1 \end{bmatrix}$$

The first row of the above matrix has 1 values as all of the elements. This is particularly preferable in the described implementation since the non-redundant data packets are balanced. For any coding set in which the non-redundant coded data packets are balanced, if any single one of the set of non-redundant coded data packets is not received or recoverable at a receiver, obtaining the redundant coded data packet that is a combination of all of the source data packets ensures the ability to recover all of the source data packets.

Although the first row has been predetermined to have all 1 values, the values in the second to fourth rows may initially be randomly chosen subject to the condition that there is at least one non-zero value in each row. Preferably, the values in the second to fourth rows are then iteratively improved using a heuristic technique, such as random Hill climbing. For example, a vector of exact decoding probability is computed and the probability that k, i.e. 5, data packets can be decoded is determined. The values in second to fourth rows are then changed to increase the decoding probability to a desired level.

The incidence matrix for generating a (9, 5) code is therefore:

$$\begin{bmatrix} 1 & 1 & 0 & 1 & 0 \\ 0 & 1 & 1 & 0 & 1 \\ 1 & 0 & 1 & 1 & 0 \\ 0 & 0 & 1 & 1 & 1 \\ 1 & 1 & 0 & 0 & 1 \\ 1 & 1 & 1 & 1 & 1 \\ 1 & 0 & 1 & 1 & 0 \\ 1 & 1 & 1 & 1 & 0 \\ 1 & 1 & 0 & 1 & 1 \end{bmatrix}$$

As described for the first embodiment, each of the rows identifies source data packets for combining to generate a coded data packet. In order to realise the advantage of each coded data packet having a high probability of being linearly independent, one of the data packets used to generate each of the coded data packets is multiplied by a value, other than 0 or 1, from a higher GF field.

The first five rows of the above matrix correspond the incidence matrix of the first embodiment and the same operations as described for the first embodiment may be used to generate these coded data packets.

For the additional rows of binary values for generating redundant data packets, the further operation of multiplying a value in each row by a value from a higher GF field than GF(2) is performed. In each row, a position with the element '1' is chosen and it is multiplied by a randomly selected value from a higher GF field, with the randomly selected value allowed to be any other value than 0 or 1. Preferably, the '1' elements are selected randomly but subject to sufficient conditions to ensure that the selection process results in the same, or approximately the same, number of multiplied values in each column of the matrix.

The resulting matrix that defines which data packets are used to generate each coded data packet, which of the data packets are multiplied and the multiplication values used may be as shown below:

$$\begin{bmatrix} f(3) & 1 & 0 & 1 & 0 \\ 0 & 1 & 1 & 0 & f(7) \\ 1 & 0 & 1 & f(6) & 0 \\ 0 & 0 & f(5) & 1 & 1 \\ 1 & f(4) & 0 & 0 & 1 \\ 1 & f(7) & 1 & 1 & 1 \\ f(7) & 0 & 1 & 1 & 0 \\ 1 & 1 & f(3) & 1 & 0 \\ 1 & 1 & 0 & 1 & f(3) \end{bmatrix}$$

As described for the first embodiment, the above matrix needs to have an inverse and/or rank greater than or equal to a predetermined number in order for coded data packets generated according to the matrix to be decodable. Preferably, a check is therefore performed on the above matrix to determine if it is non-singular and/or has a rank below the predetermined number. In the event that the matrix is not non-singular and/or has a rank below the predetermined number, then the matrix is changed such that other 1 values in the binary matrix are replaced and/or other multiplication values are used, with the condition of the multiplication values not being 0 or 1 still being maintained. This process is repeated until a non-singular matrix and/or matrix with a rank greater than or equal to a predetermined number, with at least one multiplication value in each row, is obtained.

The operations for multiplying and combining the source data packets to generate each coded data packet are as described for the first embodiment.

The operation of a decoder for recovering the source data packets may be as described for the first embodiment.

Advantageously, the robustness of coded data packets is increased by the introduced redundancy.

A second exemplary implementation of the second embodiment is provided below in which a (12, 8) code is generated.

The following Latin square is randomly generated:

$$\begin{bmatrix} 5 & 1 & 8 & 4 & 7 & 6 & 2 & 3 \\ 2 & 5 & 3 & 7 & 1 & 8 & 4 & 6 \\ 7 & 2 & 1 & 8 & 5 & 3 & 6 & 4 \\ 1 & 8 & 5 & 6 & 4 & 7 & 3 & 2 \\ 3 & 6 & 4 & 1 & 8 & 2 & 5 & 7 \\ 6 & 4 & 7 & 3 & 2 & 5 & 8 & 1 \\ 4 & 3 & 2 & 5 & 6 & 1 & 7 & 8 \\ 8 & 7 & 6 & 2 & 3 & 4 & 1 & 5 \end{bmatrix}$$

The first three rows of the Latin square are taken and, using the technique described in the first embodiment, the following binary matrix is generated that defines the source data packets for combining to generate each coded data packet:

$$A1 = \begin{bmatrix} 0 & 1 & 0 & 0 & 1 & 0 & 1 & 0 \\ 1 & 1 & 0 & 0 & 1 & 0 & 0 & 0 \\ 1 & 0 & 1 & 0 & 0 & 0 & 0 & 1 \\ 0 & 0 & 0 & 1 & 0 & 0 & 1 & 1 \\ 1 & 0 & 0 & 0 & 1 & 0 & 1 & 0 \\ 0 & 0 & 1 & 0 & 0 & 1 & 0 & 1 \\ 0 & 1 & 0 & 1 & 0 & 1 & 0 & 0 \\ 0 & 0 & 1 & 1 & 0 & 1 & 0 & 0 \end{bmatrix}$$

The source data packets for generating each of the redundant data packets are determined by taking the last four rows of the Latin square and similarly using them to generate the following binary matrix:

$$R1 = \begin{bmatrix} 0 & 0 & 1 & 1 & 0 & 1 & 0 & 1 \\ 0 & 0 & 1 & 1 & 0 & 1 & 1 & 0 \\ 0 & 1 & 0 & 1 & 0 & 1 & 1 & 0 \\ 1 & 1 & 1 & 0 & 1 & 0 & 0 & 0 \\ 0 & 1 & 1 & 0 & 0 & 1 & 0 & 1 \\ 1 & 1 & 0 & 1 & 1 & 0 & 0 & 0 \\ 1 & 0 & 0 & 0 & 1 & 0 & 1 & 0 \\ 1 & 0 & 0 & 0 & 1 & 0 & 1 & 1 \end{bmatrix}$$

In order to generate a binary matrix that defines four redundant data packets, the first four rows of R1 are taken to form R1' as shown below:

$$R1' = \begin{bmatrix} 0 & 0 & 1 & 1 & 0 & 1 & 0 & 1 \\ 0 & 0 & 1 & 1 & 0 & 1 & 1 & 0 \\ 0 & 1 & 0 & 1 & 0 & 1 & 1 & 0 \\ 1 & 1 & 1 & 0 & 1 & 0 & 0 & 0 \end{bmatrix}$$

The binary matrix B1 for the (12,8) code is then generated by combining the matrices A1 and R1' as shown below:

$$B1 = \begin{bmatrix} 0 & 1 & 0 & 0 & 1 & 0 & 1 & 0 \\ 1 & 1 & 0 & 0 & 1 & 0 & 0 & 0 \\ 1 & 0 & 1 & 0 & 0 & 0 & 0 & 1 \\ 0 & 0 & 0 & 1 & 0 & 0 & 1 & 1 \\ 1 & 0 & 0 & 0 & 1 & 0 & 1 & 0 \\ 0 & 0 & 1 & 0 & 0 & 1 & 0 & 1 \\ 0 & 1 & 0 & 1 & 0 & 1 & 0 & 0 \\ 0 & 0 & 1 & 1 & 0 & 1 & 0 & 0 \\ 0 & 0 & 1 & 1 & 0 & 1 & 0 & 1 \\ 0 & 0 & 1 & 1 & 0 & 1 & 1 & 0 \\ 0 & 1 & 0 & 1 & 0 & 1 & 1 & 0 \\ 1 & 1 & 1 & 0 & 1 & 0 & 0 & 0 \end{bmatrix}$$

The matrix B1 defines source data packets for combining to generate each coded data packet. In order to realise the advantage of obtained coded data packets having a high likelihood of being linearly independent, one of the identified data packets by each of the rows of B1 is replaced by an element, other than 0 or 1, in a higher GF field than GF(2). As described above, this process may be by randomly selecting a value to change in each row or other techniques. Accordingly, with the higher field being GF(8), the following matrix, G, may be generated:

$$G = \begin{bmatrix} 0 & 1 & 0 & 0 & 1 & 0 & 7 & 0 \\ 1 & 2 & 0 & 0 & 1 & 0 & 0 & 0 \\ 4 & 0 & 1 & 0 & 0 & 0 & 0 & 1 \\ 0 & 0 & 0 & 1 & 0 & 0 & 1 & 5 \\ 1 & 0 & 0 & 0 & 4 & 0 & 1 & 0 \\ 0 & 0 & 5 & 0 & 0 & 1 & 0 & 1 \\ 0 & 1 & 0 & 1 & 0 & 3 & 0 & 0 \\ 0 & 0 & 1 & 7 & 0 & 1 & 0 & 0 \\ 0 & 0 & 1 & 1 & 0 & 5 & 0 & 1 \\ 0 & 0 & 1 & 4 & 0 & 1 & 1 & 0 \\ 0 & 2 & 0 & 1 & 0 & 1 & 1 & 0 \\ 1 & 1 & 1 & 0 & 2 & 0 & 0 & 0 \end{bmatrix}$$

The number of columns of G corresponds to the number of source data packets with each column identifying a different source data packet. The number of rows of G corresponds to the number of coded data packets with each row corresponding to a different coded data packet.

Suppose the eight source data packets, P1 to P8, are as shown below:
P1=010000111101
P2=011011010001
P3=011011000001
P4=000101011011
P5=001001000011
P6=111010001011
P7=001101111000
P8=111110001011

Each of the data packets can be represented as sequences of numbers in the same higher GF field used for the multiplication value, in this example GF(8), as shown below:
P1=010 000 111 101=2 0 7 5
P2=011 011 010 001=3 3 2 1
P3=011 011 000 001=3 3 0 1
P4=000 101 011 011=0 5 3 3
P5=001 001 000 011=1 1 0 3
P6=111 010 001 011=7 2 1 3
P7=001 101 111 000=1 5 7 0
P8=111 110 001 011=7 6 1 3

A matrix, P, of the source data packets in GF(8) can therefore be generated as:

$$P = \begin{bmatrix} 2 & 0 & 7 & 5 \\ 3 & 3 & 2 & 1 \\ 3 & 3 & 0 & 1 \\ 0 & 5 & 3 & 3 \\ 1 & 1 & 0 & 3 \\ 7 & 2 & 1 & 3 \\ 1 & 5 & 7 & 0 \\ 7 & 6 & 1 & 3 \end{bmatrix}$$

The encoding process to generate the coded data packets is the matrix multiplication G×P in GF(8) which generates a matrix, E, of coded data packets:

$$E = \begin{bmatrix} 5 & 3 & 0 & 2 \\ 5 & 7 & 3 & 4 \\ 1 & 5 & 7 & 1 \\ 0 & 4 & 1 & 1 \\ 7 & 1 & 0 & 4 \\ 2 & 6 & 0 & 5 \\ 7 & 0 & 2 & 7 \\ 4 & 0 & 5 & 6 \\ 5 & 7 & 7 & 3 \\ 5 & 7 & 7 & 3 \\ 0 & 4 & 1 & 2 \\ 0 & 2 & 5 & 3 \end{bmatrix}$$

The generated coded data packets E1 to E12 respectively correspond to rows 1 to 12 of E. Although E has been shown as a matrix of GF(8) values, each of these GF(8) values corresponds to a three bit binary value and E could alternatively have been shown as a matrix with twelve columns of binary values that shows the actual binary values of each coded data packet.

Advantageously, each coded data packet has a high likelihood of being linearly independent at a decoder due to the use of values for a higher GF field than GF(2). In addition, the encoding process has similar coding complexity to operations exclusively performed in GF(2) since the G×P computation does not need to perform a GF(8) multiplication on most of the source data packets used to generate a coded data packet.

At a decoder, suppose that the only the coded data packets that are received and/or recoverable are E3, E4, E5, E6, E7, E9, E11 and E12.

The received coded data packets may be represented by the following matrix:

$$E' = \begin{bmatrix} 1 & 5 & 7 & 1 \\ 0 & 4 & 1 & 1 \\ 7 & 1 & 0 & 4 \\ 2 & 6 & 0 & 5 \\ 7 & 0 & 2 & 7 \\ 5 & 7 & 7 & 3 \\ 0 & 4 & 1 & 2 \\ 0 & 2 & 5 & 3 \end{bmatrix}$$

The decoder selects the rows of G that correspond to the data packets received, i.e. rows 3, 4, 5, 6, 7, 9, 11 and 12, and generates the following matrix:

$$G1 = \begin{bmatrix} 4 & 0 & 1 & 0 & 0 & 0 & 0 & 1 \\ 0 & 0 & 0 & 1 & 0 & 0 & 1 & 5 \\ 1 & 0 & 0 & 0 & 4 & 0 & 1 & 0 \\ 0 & 0 & 5 & 0 & 0 & 1 & 0 & 1 \\ 0 & 1 & 0 & 1 & 0 & 3 & 0 & 0 \\ 0 & 0 & 1 & 1 & 0 & 5 & 0 & 1 \\ 0 & 2 & 0 & 1 & 0 & 1 & 1 & 0 \\ 1 & 1 & 1 & 0 & 2 & 0 & 0 & 0 \end{bmatrix}$$

The decoder uses Gaussian elimination to compute the inverse of G1 as:

$$G1^{-1} = \begin{bmatrix} 4 & 2 & 2 & 5 & 4 & 6 & 0 & 4 \\ 7 & 1 & 2 & 3 & 3 & 1 & 3 & 4 \\ 1 & 0 & 7 & 6 & 0 & 7 & 7 & 3 \\ 1 & 3 & 7 & 3 & 6 & 0 & 4 & 3 \\ 1 & 7 & 5 & 0 & 5 & 0 & 2 & 1 \\ 2 & 5 & 3 & 0 & 7 & 4 & 6 & 6 \\ 0 & 4 & 0 & 5 & 7 & 6 & 5 & 0 \\ 7 & 5 & 2 & 5 & 7 & 5 & 7 & 4 \end{bmatrix}$$

The source data packets, P, can then be recovered by the following matrix multiplication:

$$G1^{-1} \times E' = \begin{bmatrix} 2 & 0 & 7 & 5 \\ 3 & 3 & 2 & 1 \\ 3 & 3 & 0 & 1 \\ 0 & 5 & 3 & 3 \\ 1 & 1 & 0 & 3 \\ 7 & 2 & 1 & 3 \\ 1 & 5 & 7 & 0 \\ 7 & 6 & 1 & 3 \end{bmatrix}$$

The above demonstrates that despite the loss of data packets E1, E2, E8 and E10, the redundancy ensures that all of the source data packets, P, can still be correctly recovered.

The above-described first and second implementations of the second embodiment are examples of the generation of non-systematic sets of coded data packets.

The second embodiment also includes the generation of a systematic set of coded data packets. With a systematic set of coded data packets, some of the coded data packets correspond to the uncoded source data packets and coding of source data packets is only applied to redundant data packets. Advantageously, this can allow fast and efficient decoding since all the source data packets can potentially be directly recovered, without the need to decode any of the redundant data packets.

Described below is a third implementation of the second embodiment in which a systematic set of coded data packets is generated.

In the third implementation, a matrix defining the data packets for combining to generate a systematic set of coded data packets comprises the identity matrix. Accordingly, the matrix may be as shown below:

$$\begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & GF(7) & 1 & 1 & 1 \\ GF(7) & 0 & 1 & 1 & 0 \\ 1 & 1 & GF(3) & 1 & 0 \\ 1 & 1 & 0 & 1 & GF(3) \end{bmatrix}$$

The above matrix differs from the above matrix of the first and second implementations of second embodiment in that the first five rows correspond to the identity matrix. The effect of this is that there is a generated coded data packet that corresponds to each of the source data packets. The final four rows of the above matrix may be generated according to any of the previously described techniques of the first or second implementations of the second embodiment. As described for the first implementation of the second embodiment, a check is preferably performed to determine if the above matrix is non-singular and/or has a rank greater than or equal to a predetermined number. However, in the event that the above matrix is not non-singular and/or has a rank below the predetermined number, only the multiplication values and selected 1 values for multiplying are changed in the rows corresponding redundant coded data packets.

The redundant data packets provide the advantage of an obtained coded data packet having a high likelihood of being linearly independent and being generated with low complexity.

A fourth implementation of the second embodiment is described below in which a systematic (12, 8) code is generated.

First, an 8×8 identity matrix, A1, is generated as shown below:

$$A1 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$

An 8×8 Latin square is randomly generated as shown below:

$$\begin{bmatrix} 8 & 7 & 6 & 3 & 1 & 2 & 5 & 4 \\ 4 & 1 & 5 & 2 & 8 & 3 & 7 & 6 \\ 2 & 4 & 7 & 5 & 6 & 8 & 1 & 3 \\ 7 & 3 & 1 & 6 & 5 & 4 & 2 & 8 \\ 6 & 2 & 8 & 1 & 3 & 7 & 4 & 5 \\ 1 & 6 & 2 & 8 & 4 & 5 & 3 & 7 \\ 3 & 5 & 4 & 7 & 2 & 6 & 8 & 1 \\ 5 & 8 & 3 & 4 & 7 & 1 & 6 & 2 \end{bmatrix}$$

A preferable way of ensuring that the same number of source data packets are used to generate each redundant data packet is to take a sub-rectangle of the above Latin square. One dimension of the sub-rectangle defines the number of redundant data packets and the other dimension of the sub-rectangle defines how many source data packets are used to generate each redundant data packet. By taking the rectangle as the rectangle comprised by the bottom 6 rows of the above Latin square (to define how many and which of the source data packets are used in redundant data packets) and the first four columns of the above Latin square (with each column corresponding to a different redundant date packet), the rectangle defines a binary matrix for generating coded data packets, RS1, as:

$$RS1 = \begin{bmatrix} 1 & 1 & 1 & 0 & 1 & 1 & 1 & 0 \\ 0 & 1 & 1 & 1 & 1 & 1 & 0 & 1 \\ 1 & 1 & 1 & 1 & 0 & 0 & 1 & 1 \\ 1 & 0 & 0 & 1 & 1 & 1 & 1 & 1 \end{bmatrix}$$

A binary matrix, BS1, that defines the source data packets used to generate each coded data packet of the (12, 8) systematic code is:

$$BS1 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 1 & 1 & 0 & 1 & 1 & 1 & 0 \\ 0 & 1 & 1 & 1 & 1 & 1 & 0 & 1 \\ 1 & 1 & 1 & 1 & 0 & 0 & 1 & 1 \\ 1 & 0 & 0 & 1 & 1 & 1 & 1 & 1 \end{bmatrix}$$

As in the previous implementations, values in BS1 are replaced by elements, other than 0 and 1, from a higher GF field than GF(2) in order to increase the likelihood of received data packets being linearly independent. However, the values from the higher GF field are only introduced into the redundant data packets and not the rows of BS1 that correspond to uncoded source data packets. In the present exemplary implementation, three of the elements in the rows of BS1 that correspond to the redundant data packets are changed, rather than only one as in the previously described implementations of the second embodiment and first embodiment. The changed elements may be randomly selected or selected in a predetermined manner. Advantageously, changing more than three elements in a row of BS1 further increases the likelihood of the redundant data packets being linearly independent. Since source data packets are transmitted as most of the coded data packets, the overall number of computations required for generating all of the coded data packets remains similar to that for generating the non-systemic coded data packets of the above-described second implementation of the second embodiment. As there is still no need to multiply all the source data packets that generate each coded data packet by a value form the higher GF field, the technique is more computationally efficient than known operations in a higher GF field than GF(2) that always perform multiplication operations on all of the source data packets used to generate coded data packets. The resulting generator matrix, GS, may be as shown below.

$$GS = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 1 & 2 & 0 & 2 & 7 & 1 & 0 \\ 0 & 7 & 1 & 3 & 2 & 1 & 0 & 1 \\ 1 & 1 & 1 & 4 & 0 & 0 & 5 & 3 \\ 5 & 0 & 0 & 5 & 1 & 1 & 1 & 2 \end{bmatrix}$$

Suppose the data packets to be encoded are the same data packets P1 to P8, represented as the matrix P, as used in the above-described second implementation of the second embodiment:

$$P = \begin{bmatrix} 2 & 0 & 7 & 5 \\ 3 & 3 & 2 & 1 \\ 3 & 3 & 0 & 1 \\ 0 & 5 & 3 & 3 \\ 1 & 1 & 0 & 3 \\ 7 & 2 & 1 & 3 \\ 1 & 5 & 7 & 0 \\ 7 & 6 & 1 & 3 \end{bmatrix}$$

The encoding process to generate the systematic set of coded data packets is the matrix multiplication GS×P in GF(8) which generates a matrix, ES, of coded data packets:

$$ES = \begin{bmatrix} 2 & 0 & 7 & 5 \\ 3 & 3 & 2 & 1 \\ 3 & 3 & 0 & 1 \\ 0 & 5 & 3 & 3 \\ 1 & 1 & 0 & 3 \\ 7 & 2 & 1 & 3 \\ 1 & 5 & 7 & 0 \\ 7 & 6 & 1 & 3 \\ 6 & 1 & 5 & 4 \\ 5 & 3 & 6 & 5 \\ 3 & 2 & 6 & 1 \\ 3 & 1 & 7 & 2 \end{bmatrix}$$

The generated coded data packets ES1 to ES12 respectively correspond to rows 1 to 12 of ES. Since a systematic code has been generated, the first eight rows of ES directly correspond to the source data packets P. Although ES has been shown as a matrix of GF(8) values, each of these GF(8) values corresponds to a three bit binary value and ES could alternatively have been shown as a matrix with twelve columns of binary values that shows the actual binary values of each coded data packet.

At a decoder, suppose that the only the coded data packets that are received and/or recoverable are ES3, ES4, ES5, ES6, ES7, ES8, ES9, ES10 and ES11. That is to say, ES1, ES2 and ES3 have been lost.

The obtained coded data packets by the decoder can be represented as:

$$ES' = \begin{bmatrix} 3 & 3 & 0 & 1 \\ 0 & 5 & 3 & 3 \\ 1 & 1 & 0 & 3 \\ 7 & 2 & 1 & 3 \\ 1 & 5 & 7 & 0 \\ 7 & 6 & 1 & 3 \\ 6 & 1 & 5 & 4 \\ 5 & 3 & 6 & 5 \\ 3 & 2 & 6 & 1 \end{bmatrix}$$

The decoder selects the rows of GS that correspond to the obtained data packets, i.e. rows 3, 4, 5, 6, 7, 8, 9, 10 and 11, and generates the following matrix:

$$GS1 = \begin{bmatrix} 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 1 & 2 & 0 & 2 & 7 & 1 & 0 \\ 0 & 7 & 1 & 3 & 2 & 1 & 0 & 1 \\ 1 & 1 & 1 & 4 & 0 & 0 & 5 & 3 \end{bmatrix}$$

GS1 is a 9×8 matrix that cannot be inverted, i.e. it is singular. However, the rank of GS1 is 8. The rank of GS1 can be computed using Gaussian elimination (row reduction) as is known in the art. The rank of 8 indicates that there is a unique solution to the equation:

$GS1 \times P = ES'$

To obtain P form GS1 and ES', the decoder may use a technique based on Gaussian elimination as would be known to a person skilled in the art. There are many other techniques for solving the above equation to obtain P, such as the set of algorithms provided by LAPACK, see http://www.netlib.org/lapack/ as viewed on 23 Jun. 2014.

Accordingly, the above equation can be solved to obtain P and the source data packets. Advantageously, recovering the source data packets for systematic codes can be faster than for non-systematic codes since many of the obtained data packets may be original source data packets.

It is particularly preferable to generate redundant coded data packets according to the second embodiment in applications in which the coded data packets are transmitted over a network experiencing an unacceptably large amount of loss of data packets. The use of redundant data packets can improve the data transmission performance of the network. The amount of redundancy introduced according to the second embodiment is preferably adjustable, and can be increased or decreased in response to a determined network performance. Accordingly, coded data packets may first be generated according to the first embodiment with no redundancy applied. If it is determined that the loss of data packets within the network is unacceptable, redundancy can be introduced by applying the technique according to the second embodiment to introduce one or more redundant coded data packets. If the loss of data packets is still determined to be unacceptable, the coding can be changed to have more redundant coded data packets. It the amount of loss of data packets within the network is then determined to decrease, the number of redundant data packets may then be decreased.

It is necessary for a decoder to know how each obtained coded data packet has been encoded in order for the coded data packet to be usable in the decoding process. Accordingly, each coded data packet preferably also comprises additional information that comprises all of the information required to use the coded data packet in a decoding process. For example, the additional information may identify the source data packets used to generate the coded data packet, the multiplication value(s) used, the GF field higher than GF(2) that has been used and an encoding and/or decoding matrix. The additional information may be prepended to the encoded data packed, i.e. attached at the head of the packet, appended to the end of the data packet, or in any other way comprised by the data packet.

The coding according to the embodiments can be applied to either finite or infinite streams of binary data. So that coding can be implemented, the data is split into data packets. A typical size of a data packet is 1500 bytes. The data packets prior to coding are referred to as source data packets or original data packets. It is known to generate sub packets by splitting any size of data packet into smaller packets. The data packets described throughout the present document, and used in embodiments of the invention, may be data packets of any size and, although referred to as data packets, may have been generated as sub packets of larger packets.

For both the above-described first and second embodiments, the data packets may be transmitted over a network. The network may comprise a source node where the data packets are transmitted from, one or more sink nodes (i.e. destinations) where the data packets are transmitted to, and, optionally, one or more intermediate nodes between the source and sink nodes. The transmission of the coded data packets over the network may occur over a number of phases.

The generation of coded data packets by the above-described first and second embodiments may be only performed by such a source node in a network with the intermediate nodes within the network relaying the received coded data packets onto other intermediate nodes or sink nodes without further coding the coded data packets. However, embodiments also include coding operations being performed by intermediate nodes within the network. The coding operations performed by the intermediate nodes may be known techniques for combining received coded data packets or use the techniques of the first and second embodiments to further encode the received data packets.

In a preferred implementation, the intermediate nodes buffer, i.e. store, the additional information of each data packet that they receive and transmit, and, optionally, the payload of each data packet. Each intermediate node of the network node may try to ensure that all of the further coded data packets that it transmits are different from any previously transmitted encoded data packets by the node. Each intermediate node therefore compares the additional information buffered in the node with the additional information of a coded data packet that it has generated. The intermediate node can then determine to transmit the coded data packet if the result of the comparison indicates that the coded data packet has not been transmitted or received by the node before. If the coded data packet has been transmitted or received by the node before, the node can repeatedly perform the processes of generating and comparing coded data packets with the aim of eventually generating an coded data packet that has not been transmitted or received by the node before. An intermediate node that receives coded data packets over more than two links is able to select a number of different combinations of the received coded data packets for combining using known techniques or those of the above described first and second embodiments.

Figure 3:
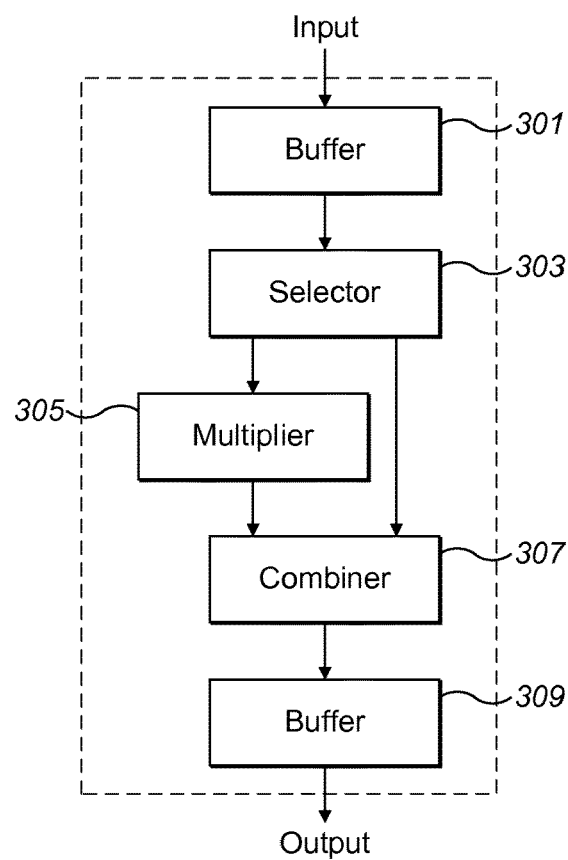
FIG. 3 shows a coder according to an embodiment.

FIG. 3 shows is a block diagram of a coder for generating coded data packets according to embodiments.

The coder comprises an input, a first buffer 301, a selector 303, a multiplier 305, a combiner 307, a second buffer 309 and an output.

The input of the coder receives source data packets for coding. The source data packets are buffered, or stored, in the first buffer 301. The selector 303 selects source data packets in the first buffer 301 for combining to generate a coded data packet. At least one of the selected source data packets is sent to the multiplier 305 that generates at least one multiplied data packet by performing one or more multiplication operations on said at least one of the selected data packets. The at least one multiplied data packet is then sent from the multiplier 305 to the combiner 307. In addition, the other of the selected source data packets for generating a coded data packet that were not multiplied are sent to the combiner 307. The combiner 307 receives both the at least one multiplied data packets and the non-multiplied data packets and combines the data packets to generate a coded data packet. The coded data packet is then sent to the second buffer 309 where it is buffered, or stored. The second buffer 309 may also comprise previously generated coded data packets. The second buffer 309 sends one or more coded data packets to the output of the coder.

The generation of coded data packets according to the embodiments described herein is applicable to data transmission, storage and management and network coding in general. In particular, embodiments have applications in all kinds of networks, including: wireless, optical, and storage networks.

A preferred application of the encoding and decoding techniques according to embodiments is for implementing erasure codes in data storage system. These are described in, for example, 'Erasure Codes for Storage Systems—A Brief Primer', by James S. Plank, http//web.eecs.utk.edu/~plank/plank/papers/Login-2013.pdf (viewed on 20 May 2014), the entire contents of which are incorporated herein by reference. Embodiments are used to generate and store coding words. These reduce the likelihood of irrecoverable data loss in the event of the failure of one or more disks, or parts of disks, of the storage system.

Another preferred application of the encoding and decoding techniques according to embodiments is Peer-to-Peer streaming of video and/or audio data. This is described in, for example, 'Network Coding Based Live Peer-to-Peer Streaming Towards Minimizing Buffering Delay', by Zhiming Zhang, Ranran Hou, Hao Chen, Jin Zhou and Jun Liu, http://security.riit.tsinghua.edu.con/share/NC-P2P.pdf (viewed on 20 May 2014), the entire contents of which are incorporated herein by reference. The network coding techniques of embodiments are used to reduce buffering delay of live P2P streaming.

Advantageously, embodiments greatly increase the probability of obtained coded data packets being linearly independent to each other and therefore contributing to a decoding process. The generation of coded data packets according to embodiments can be almost as computationally efficient as coding schemes that exclusively operate in GF(2). Embodiments are also more efficient than known coding schemes in higher GF fields than GF(2), at least because there is no inherent multiplying operation on all of the source data packets used to generate a coded data packet and embodiments use bitwise XOR operations directly on one or more source data packets that have not been multiplied to generate coded data packets.

Figure 4:
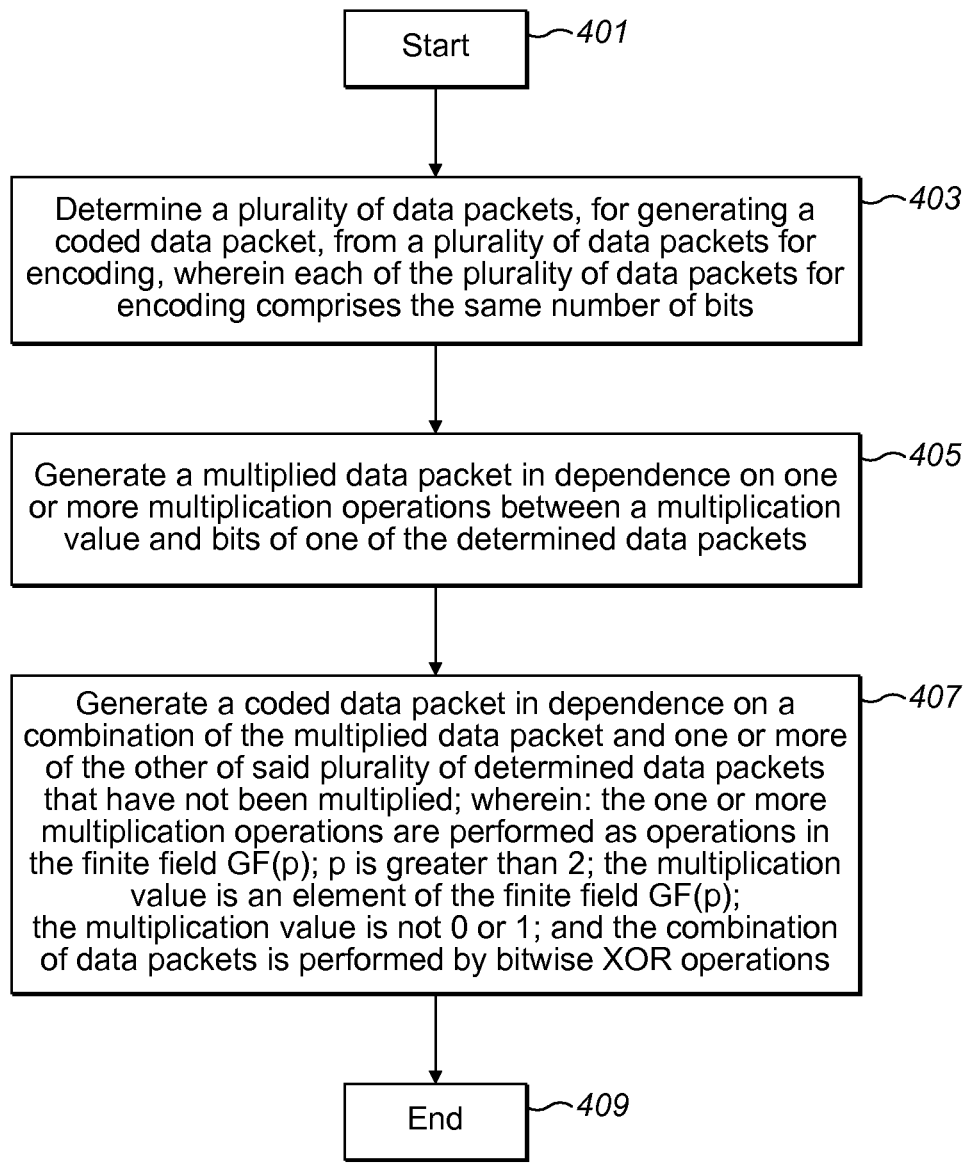
FIG. 4 is a flow chart of the processes for generating a coded data packet according to embodiments.

FIG. 4 is a flowchart of processes according to embodiments of the invention.

In step 401, the process begins.

In step 403, a plurality of data packets, for generating a coded data packet, are determined from a plurality of source data packets for encoding, wherein each of the plurality of source data packets for encoding comprises the same number of bits.

In step 405, a multiplied data packet is generated in dependence on one or more multiplication operations between a multiplication value and bits of one of the determined data packets.

In step 407, a coded data packet is generated in dependence on a combination of the multiplied data packet and one or more of the other of said plurality of determined data packets that have not been multiplied; wherein: the one or more multiplication operations are performed as operations in the finite field $GF(p)$; p is greater than 2; the multiplication value is an element of the finite field $GF(p)$; the multiplication value is not 0 or 1; and the combination of data packets is performed by bitwise XOR operations.

In step 409, the process ends.

Modifications and Variations

A number of modifications and variations are possible within the scope of the invention as defined by the appended claims.

Although the embodiments have been described with the determination of which source data packets are combined to generate a coded data packet being made in dependence on a Latin rectangle, this is in no way essential. Embodiments include any technique for determining which data packets are combined to generate each coded data packet, such as other techniques for ensuring that the coded data packets are generated in a balanced manner or randomly selecting which data packets are combined to generate each coded data packet. More generally, embodiments include any scheme for generating or obtaining data packets so long as at least one of the data packets is a coded data packet generated according to an embodiment described herein.

In most of the implementations of the above-described embodiments, only one of the source data packets used to generate a coded data packet is multiplied by a multiplication value from a higher GF field than GF(2). Embodiments also include more than one of the source data packets used to generate a coded data packet being multiplied by a multiplication value, other than 0 or 1, from the higher GF field. This increases the coding complexity but has the advantage of further increasing the likelihood of the coded data packet being linearly independent. The technique is still computationally advantageous over known coding techniques in fields higher than GF(2) so long as at least one coded data packet is generated in dependence on a bitwise XOR operation performed directly on a source data packet that has not been inherently multiplied.

Embodiments also include an incidence matrix of binary values being obtained in dependence on a Latin rectangle as described for the first embodiment. The inverse of the incidence matrix is then obtained and it is the inverse matrix that defines the data packets to be multiplied in order to generate each coded data packet. The multiplying of at least one source data packet used to generate each coded data packet and combining of data packets to generate a coded data packet is performed using the same operations described for the first embodiment. Redundant data packets may also be generated according to the techniques of the second embodiment. Advantageously, this improves the efficiency and speed of a decoder by ensuring that the same number of coded data packets are required to recover each source data packet.

A person skilled in the art would know how to implement all of the mathematical theory and operations described throughout the present document with the use of one or more computing devices. Any, or all, of the operations described throughout the present document may be performed automatically by one or more computing devices.

The flowchart and description thereof herein should not be understood to prescribe a fixed order of performing the method steps described therein. Rather the method steps may be performed in any order practicable. Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

The invention claimed is:

1. A method of generating a coded data packet in dependence on a plurality of source data packets, the method comprising:
   determining a plurality of data packets, for generating a coded data packet, from a plurality of source data packets for encoding, wherein each of the plurality of source data packets for encoding comprises the same number of bits;
   generating a multiplied data packet in dependence on one or more multiplication operations between a multiplication value and bits of one of the determined data packets; and
   generating a coded data packet in dependence on a combination of the multiplied data packet and one or more of the other of said plurality of determined data packets that have not been multiplied;
   wherein the one or more multiplication operations are performed as operations in the finite field GF(p);
   p is greater than 2;
   the multiplication value is an element of the finite field GF(p);
   the multiplication value is not 0 or 1; and
   the combination of data packets is performed by bitwise XOR operations.

2. The method according to claim 1, further comprising generating one or more further coded data packets in dependence on said plurality of source data packets for encoding, wherein each of the further coded data packets is generated by:
   determining a plurality of data packets, for generating the further coded data packet, from said plurality of source data packets for encoding;
   generating a further multiplied data packet in dependence on one or more multiplication operations between a further multiplication value and bits of one of the determined data packets for generating the further coded data packet; and
   generating the further coded data packet in dependence on a combination of the further multiplied data packet and one or more of the other of the determined data packets for generating the further coded data packet that have not been multiplied;
   wherein each multiplication value is element of the same finite field GF(p);
   each multiplication value is not 0 or 1; and
   the combination for generating each further encoded data packet is performed by bitwise XOR operations.

3. The method according to claim 1, wherein the determined plurality of data packets for generating each coded data packet are determined in dependence on a Latin rectangle.

4. The method according to claim 3, further comprising:
   generating the Latin rectangle by generating a Latin square; and
   selecting a plurality of either the rows or the columns of the Latin square.

5. The method according to claim 3 further comprising:
   generating a Latin rectangle; and
   generating a non-singular matrix of binary values in dependence on the Latin rectangle;
   wherein each of the determined plurality of data packets for generating a coded data packet is determined in dependence on binary values in either a single a row or a single column of said non-singular matrix of binary values.

6. The method according to claim 5, wherein the determined plurality of data packets for generating a coded data packet are determined by binary '1' values in either a single a row or a single column of said non-singular matrix of binary values.

7. The method according to claim 3, further comprising selecting a row or column of the Latin rectangle; and
   determining one of the determined plurality of data packets for multiplying to generate a multiplied data packet in dependence on a value in the selected row.

8. The method according to claim 7, wherein the row or column of the Latin rectangle is randomly selected.

9. The method according to claim 1, wherein one or more of the coded data packets, optionally all of the coded data packets, are generated in dependence on only one multiplied data packet and all of the other of the plurality of determined data packets for generating the coded data packet.

10. The method according to claim 1, wherein p is 4 or 8.

11. The method according to claim 1, further comprising randomly selecting the multiplication values from the values in the GF(p) field that are not 0 or 1.

12. The method according to claim 1, wherein each multiplied data packet is generated by multiplying each of a plurality of blocks of bits of the data packet by the same multiplication value such that the multiplied data packet comprises the results of the multiplications for each of the blocks of bits;

wherein the number of bits in each block is determined by the number of bits required for a binary representation of an element in the GF(p) field.

13. The method according to claim 1, wherein each of the one or more multiplication operations for generating a multiplied data packet are performed by a look-up operation.

14. The method according to claim 2, wherein the method comprises generating a set of coded data packets that encodes all of said plurality of source data packets for encoding, the method further comprising:
    generating one or more additional coded data packets, that are redundant data packets, by, for each additional coded data packet:
    determining a plurality of data packets, for generating the additional coded data packet, from said plurality of source data packets for encoding;
    generating an additional multiplied data packet in dependence on one or more multiplication operations between an additional multiplication value and bits of one of the determined data packets for generating the additional coded data packet; and
    generating the additional coded data packet in dependence on a combination of the additional multiplied data packet and one or more of the other of the determined data packets for generating the additional coded data packet that have not been multiplied;
    wherein each multiplication value is element of the same finite field GF(p);
    each multiplication value is not 0 or 1; and
    the combination for generating each additional encoded data packet is performed by bitwise XOR operations.

15. The method according to claim 14, wherein the set of coded data packets that encodes all of said plurality of source data packets for encoding is generated in dependence on a Latin rectangle, such that the set of coded data packets are encoded and/or decodable in a balanced manner.

16. The method according to claim 14, wherein one of the coded data packets that is a redundant data packet is generated in dependence on all of the source data packets for encoding.

17. The method according to claim 14, wherein the plurality of data packets for generating one or more coded data packets that are redundant data packets are determined in dependence on a random Hill climbing algorithm.

18. The method according to claim 2, the method further comprising the steps of:
    obtaining a matrix that is dependent on determined multiplication values for generating each of the multiplied data packets and the determined data packets for combining to generate each coded data packet;
    determining if the obtained matrix is non-singular and/or has a rank greater than or equal to a predetermined value;
    if the matrix is singular and/or has a rank below the predetermined value, repeatedly changing one or more of the multiplication values and/or determined data packets for multiplying by a multiplication value until it is determined that the matrix is non-singular and/or has a rank greater than or equal to the predetermined value; and
    determining the data packets and multiplication values for using to generate the coded data packets in dependence on the values in the matrix that has been determined to be non-singular and/or have a rank greater than or equal to a predetermined value.

19. The method according to claim 3, the method further comprising:
    determining a first dimension of the Latin rectangle in dependence on the number of non-redundant coded data packets to be generated; and
    determining a second dimension of the Latin rectangle in dependence on a desired number of data packets for generating each coded data packet without redundancy being applied, wherein the second dimension is less than the first dimension.

20. The method according to claim 19, further comprising changing the second dimension of the Latin rectangle such that the second dimension is increased in response to a determination to increase the coding and/or decoding complexity of the coded data packets, and the second dimension of the Latin rectangle is decreased in response to a determination to decrease the coding and/or decoding complexity of the coded data packets.

21. The method according to claim 2, further comprising:
    performing the method in a source of data packets in a network; and
    transmitting the coded data packets over the network.

22. The method according to claim 21, further comprising:
    buffering one or more of the coded data packets prior to the one or more buffered coded data packets being transmitted; and
    transmitting the coded data packets in a series of phases.

23. The method according to claim 2, further comprising storing the coded data packets in a storage system.

24. A method of generating a systematic set of coded data packets, the method comprising generating a systematic set of coded data packets that comprises all of a plurality of source data packets for encoding and at least one coded data packet, that is a redundant data packet, and generated according to the method of claim 1.

* * * * *